United States Patent [19]

Tanaka et al.

[11] Patent Number: 4,958,216
[45] Date of Patent: Sep. 18, 1990

[54] PACKAGE FOR HOUSING SEMICONDUCTOR ELEMENTS

[75] Inventors: Jun Tanaka; Hitoshi Oikawa; Yoshinobu Kunitomo; Masami Terasawa, all of Kokubu, Japan

[73] Assignee: Kyocera Corporation, Kyoto, Japan

[21] Appl. No.: 198,111

[22] Filed: May 24, 1988

[30] Foreign Application Priority Data

| Mar. 23, 1987 | [JP] | Japan | 62-69554 |
| May 25, 1987 | [JP] | Japan | 62-127398 |
| May 30, 1987 | [JP] | Japan | 62-136995 |

[51] Int. Cl.$^5$ ............................................. H01C 23/30
[52] U.S. Cl. ........................................ 357/73; 357/74; 357/80
[58] Field of Search ............... 357/73, 74, 67, 80, 357/72

[56] References Cited

U.S. PATENT DOCUMENTS

| 3,927,815 | 12/1975 | Mase et al. | 357/80 |
| 4,630,095 | 12/1986 | Otsuka et al. | 357/73 |

FOREIGN PATENT DOCUMENTS

| 57-056142 | 4/1982 | Japan. | |
| 58-35945 | 3/1983 | Japan | 357/73 |
| 60-234751 | 11/1985 | Japan. | |
| 63-291860 | 11/1988 | Japan. | |

Primary Examiner—Rolf Hille
Assistant Examiner—Hoanganh Le
Attorney, Agent, or Firm—Spensley Horn Jubas & Lubitz

[57] ABSTRACT

Disclosed is a package for housing semiconductor elements, which comprises an insulating substrate having in the interior thereof a cavity for attaching and housing semiconductor elements and a lid member covering said cavity, wherein the insulating substrate is composed of a mullite sintered body comprising 70 to 95% by weight of mullite and 5 to 30% by weight, as the total content, of silica ($SiO_2$) and at least one member selected from the group consisting of magnesia (MgO) and calcia (CaO), and $SiO_2$, MgO and CaO are present in the following composition expressed by % by weight based on the three components:

$100 > SiO_2 \geqq 60$, $40 \geqq MgO \geqq 0$ and $40 \geqq CaO \geqq 0$.

16 Claims, 2 Drawing Sheets

PACKAGE FOR HOUSING SEMICONDUCTOR ELEMENTS

BACKGROUND OF THE INVENTION (1) Field of the Invention

The present invention relates to an improvement in the package for housing semiconductor elements of a high-density large-size semiconductor integrated circuit such as LSI. More particularly, the present invention relates to a package for housing semiconductor elements, which is constructed by using a specific mullite sintered body as the insulating substrate.

(2) Description of the Prior Art

A package for housing elements of a semiconductor integrated circuit such as LSI or a multi-layer circuit board having elements of a semiconductor integrated circuit mounted thereon has heretofore been fabricated by using alumina ($Al_2O_3$) having an excellent electric insulating property as the substrate and forming an electric wiring of a metal such as tungsten (W), molybdenum (Mo) or manganese (Mn) on the surface of the substrate.

However, in a package or multi-layer circuit board fabricated by using alumina as the substrate, the propagation speed of a signal transmitted through the electric wiring is low because the dielectric constant of alumina constituting the substrate is as high as 9 to 10 (at room temperature and 1 MHz), and therefore, it is impossible to house or mount elements of a semiconductor integrated circuit, in which the signal propagation speed is recently increased, in or on a package or multi-layer circuit board comprising alumina as the substrate.

Furthermore, with recent increase of the density or integration degree in semiconductor integrated circuit elements, the sizes of the elements per se are increased, and in the case where such semiconductor integrated circuit elements are practically arranged in the conventional package or multi-layer circuit board, since the thermal expansion coefficient of the elements is greatly different from that of the package or circuit board, on application of heat for the practical arrangement, the package or circuit board expands more greatly than the semiconductor integrated circuit elements, with the result that such troubles as breaking of the semiconductor integrated circuit elements and peeling of the elements from the package or multi-layer circuit board take place.

Accordingly, in order to overcome these defects of the conventional package or multi-layer circuit board comprising alumina as the substrate, we tried to use, as the substrate of the package or multi-layer circuit board, mullite having a thermal expansion coefficient of 4.0 to $4.5 \times 10^{-6}/°C$. (from room temperature to 400° C.), which is substantially equal to the thermal expansion coefficient of silicon constituting semiconductor integrated circuit elements, that is, 3.0 to $3.5 \times 10^{-6}/°C$. (from room temperature, to 400° C.), and having a dielectric constant as low as 6.5 to 7.0 (at room temperature and 1 MHz).

However, since the sintering property of mullite is lower than that of alumina, the relative density of the obtained sintered body is low and about 85% of the theoretical density and the sintered body has many pores. Accordingly, in the case where the sintered body of mullite is used as the substrate of a package or multi-layer circuit board and an electric wiring is formed on the surface, a problem of breaking of the wiring because of the presence of the pores is found to rise. Moreover, since the sintered body of mullite has many pores, the heat-dissipating property is poor and therefore, it is impossible to dissipate heat generated by the mounted semiconductor integrated circuit elements effectively into the open air, with the result that the semiconductor integrated circuit elements are caused to peel off from the package or multi-layer circuit board by the heat history owing to heat generated by the elements per se.

In the case where semiconductor integrated circuit elements are connected to external lead terminals by an automatic wire bonder, registering target marks on the package or multi-layer circuit board are detected by a sensor of the automatic wire bonder to effect registration. However, since the color contrast between the golden target mark and the white mullite substrate is low, there arises a problem of occurrence of erroneous registration.

Accordingly, in order to overcome the foregoing defects, we tried to obtain a black sintered body of mullite by adding an additive such as iron oxide ($Fe_2O_3$), manganese oxide ($MnO_2$) or titanium oxide ($TiO_2$) to mullite and sintering the mixture in the open air.

However, it was found that a black mullite sintered body obtained by adding an additive as mentioned above and carrying out sintering in the open air is defective in that a metallized metal layer composed of a high-melting-point metal such as tungsten, molybdenum or manganese cannot be formed on the surface simultaneously with sintering.

In the case where a metallized metal layer as mentioned above is formed simultaneously with sintering in a reducing atmosphere, titanium oxide $TiO_2$ in the additive is reduced to a lower-order oxide $TiO_{2-x}$ and the insulating property of the mullite sintered body is degraded by the formed oxygen lattice defects. Moreover, iron oxide ($Fe_2O_3$) and manganese oxide ($MnO_2$) are reduced to metallic iron (Fe) and metallic manganese (Mn), respectively, and these metals form a solid solution with the tungsten metallized metal layer to lower the melting point. Accordingly, the fusion state is brought about at a temperature lower than the sintering temperature and it is impossible to form the metallized metal layer on the sintered body with a high adhesion strength.

SUMMARY OF THE INVENTION

It is therefore a primary object of the present invention to provide a mullite substrate which is suitably used as the substrate of a package or multilayer circuit board for housing or mounting elements of a semiconductor integrated circuit in which increase of the integration degree, the size and the signal propagation speed is recently advanced.

Another object of the present invention is to provide a black mullite sintered substrate having a high blackness, a low thermal expansion coefficient and a low dielectric constant, in which reduction of the insulating property or reduction of the adhesion is not caused even if sintering is carried out in a reducing atmosphere simultaneously with formation of a metallized metal layer.

Still another object of the present invention is to provide a package for housing semiconductor elements, in which a mullite substrate has a low thermal expansion coefficient and a low dielectric constant and the heat-dissipating property of the substrate is highly improved.

In accordance with one aspect of the present invention, there is provided a package for housing semiconductor elements, which comprises an insulating substrate having in the interior thereof a cavity for attaching and housing semiconductor elements and a lid member covering said cavity, wherein the insulating substrate is composed of a mullite sintered body comprising 70 to 95% by weight of mullite and 5 to 30% by weight, as the total content, of silica ($SiO_2$) and at least one member selected from the group consisting of magnesia (MgO) and calcia (CaO), and $SiO_2$, MgO and CaO are present in the following composition expressed by % by weight based on the three components:

$$100 > SiO_2 \geq 60,$$

$$40 \geq MgO \geq 0 \text{ and}$$

$$40 \geq CaO \geq 0.$$

In accordance with another aspect of the present invention, there is provided a package for housing semiconductor elements, which comprises an insulating substrate having in the interior thereof a cavity for attaching and housing semiconductor elements and a lid member covering said cavity, wherein the insulating substrate is composed of a black mullite sintered body comprising 80.0 to 87.0% by weight of a mullite crystal phase, 0.5 to 5.0% by weight of molybdenum and 8.0 to 19.5% by weight of a vitreous phase containing at least one member selected from the group consisting of silica, magnesia and calcia.

In accordance with still another aspect of the present invention, there is provided a package for housing semiconductor elements, which comprises an insulating substrate having in the interior thereof a cavity for attaching and housing semiconductor elements and a lid member covering said cavity, wherein the insulating substrate is composed of a mullite sintered body comprising a mullite crystal phase and a vitreous grain boundary phase, and a heat-dissipating ceramic member having a heat conductivity of at least 100 W/m.K° is attached at least to the outer surface of a semiconductor element-attaching portion of the insulating substrate.

DETAILED DESCRIPTION OF THE PREFERRED EMBODIMENTS

Figure 1:
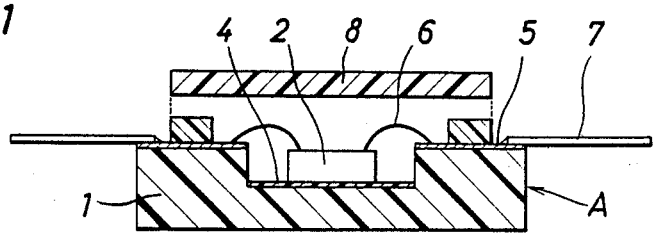
FIG. 1 is a sectional side view of a package for housing semiconductor elements according to the present invention.
Figure 2:
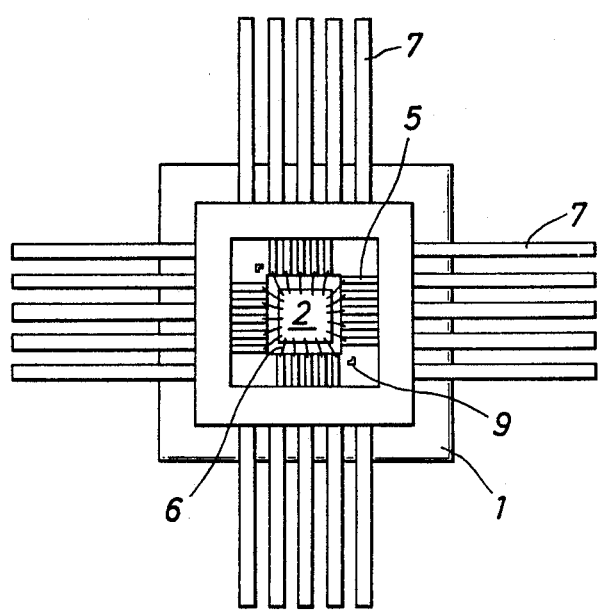
FIG. 2 is a top view of the package shown in FIG. 1.

FIG. 1 is a sectional side view showing a flat package as an embodiment of the package for housing semiconductor elements according to the present invention, and FIG. 2 is a top view thereof.

In the drawings, reference numeral 1 represents an insulating substrate composed of a mullite sintered body described in detail hereinafter, and reference numeral 8 represents a lid member. An insulating vessel A for housing semiconductor integrated circuit elements is constructed by the insulating substrate 1 and lid member 8.

A stepped concave portion defining a cavity for housing semiconductor integrated circuit elements is formed at a central part of the top face of the insulating substrate 1, and a semiconductor integrated circuit element 2 is bonded to a die attachment 4 on the bottom face of the concave portion through an adhesive.

The insulating substrate 1 composed of the mullite sintered body is formed by adding sintering aids such as $SiO_2$, MgO and CaO to a mullite powder ($3Al_2O_3 \cdot 2SiO_2$), adjusting the particle size, molding the mixture according to a known press molding method and calcining the molded mixture at a temperature of 1400° to 1800° C.

A metallized layer 5 extended from the periphery of the concave portion to the outside of the insulating vessel A is formed in the insulating substrate 1, and an electrode of the semiconductor integrated circuit element 2 is electrically connected to the periphery of the concave portion of the metallized layer 5 through a wire 6 and an external lead terminal 7 to be connected to an external circuit is attached to the part, extended to the outside of the insulating vessel A, of the metallized layer 5 through an adhesive such as a silver solder.

The metallized layer 5 is composed of a powder of a metal such as tungsten (W), molybdenum (Mo) or manganese (Mn) and is formed on the insulating substrate 1 by a known film-forming method such as a screen printing method so that the metallized layer 5 is extended from the periphery of the concave portion of the insulating substrate 1 to the outside of the insulating vessel A.

The external lead terminal 7 attached to the metallized layer 5 extended to the outside of the insulating vessel A exerts a function of connecting the housed semiconductor integrated circuit element 2 to an external circuit, and by connecting the external lead terminal 7 to the external circuit, the housed semiconductor integrated circuit element 2 is electrically connected to the external circuit through the metallized layer 5 and external lead terminal 7.

In the margin portion of the die attachment 4, on which the element is not mounted, a target mark 9 for registration at the wire-bonding step is formed.

Figure 4:
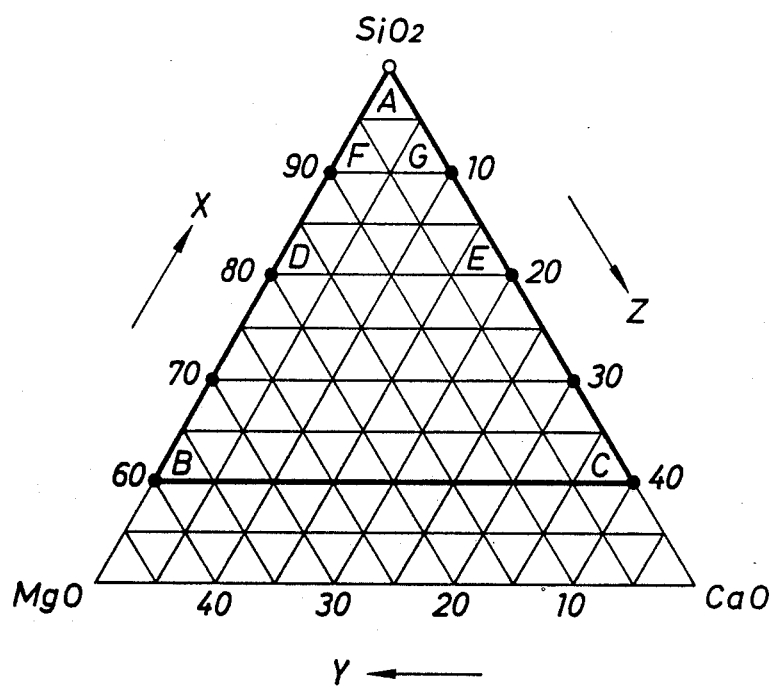
FIG. 4 is a three-component composition diagram of a vitrious grain boundary phase in a mullite substrate of the present invention.

In accordance with a first embodiment of the present invention, the insulating substrate 1 is composed of a mullite sintered body comprising 70 to 95% by weight of mullite and 5 to 30% by weight, as the total content, of $SiO_2$ and at least one member selected from the group consisting of MgO and CaO, in which the contents of $SiO_2$, MgO and CaO are within the range surrounded by the following points A, B and C, exclusive of the point A, in FIG. 4.

Incidentally, X, Y and Z represent the contents (% by weight) of $SiO_2$, MgO and CaO, respectively, and X, Y and Z satisfy the requirement of $X+Y+Z=100$.

|   | X | Y | Z |
|---|---|---|---|
| A | 100 | 0 | 0 |
| B | 60 | 40 | 0 |
| C | 60 | 0 | 40 |

Namely, the mullite sintered body of the present invention comprises a mullite ($3Al_2O_3 \cdot 2SiO_2$ to crystal phase and a vitreous grain boundary layer composed of $SiO_2$, MgO and CaO, in which solid phase reaction is not caused between mullite and $SiO_2$, MgO and CaO and a crystal phase other than the mullite phase is not contained in the sintered body. By dint of this feature, the thermal expansion coefficient can be maintained at a level substantially equal to that of silicon constituting the semiconductor integrated circuit element, and the relative density can be increased and a dense structure having a much reduced number of pores can be formed without impairing the inherent characteristic of mullite, that is, a low dielectric constant. Accordingly, the mullite sintered body of the present invention is suitably used as a substrate of a package or multi-layer circuit board for housing or mounting semiconductor integrated circuit elements.

Incidentally, in the present invention, if the amount of mullite exceeds 95% by weight, the sintering property is degraded and a dense sintered body cannot be obtained, and if the amount of mullite is smaller than 70% by weight, the amount of formed glass is increased and pores tend to remain in the sintered body. In each case, the mullite sintered body is not suitable as a substrate of a package or multi-layer circuit board for housing semiconductor elements.

At the point A of FIG. 4 showing the composition of $SiO_2$, MgO and CaO constituting the vitreous grain boundary layer, that is, in the case where only $SiO_2$ is added to mullite, the sintered body is not dense but has many pores, and the sintering temperature is very high. If the amount of $SiO_2$ is below the line BC in FIG. 4, that is, below 60% by weight, a part of mullite reacts in the solid phase with CaO as indicated by the reaction formula of $3Al_2O_3.2SiO_2 + CaO \rightarrow Al_2O_3.CaO.2SiO_2 + 2Al_2O_3$ to form anorthite ($Al_2O_3. 2SiO_2$) and alumina, with the result that the formed alumina raises the thermal expansion coefficient of mullite and the thermal expansion coefficient of the mullite sintered body becomes greatly different from that of silicon constituting the semiconductor integrated circuit element, and the mullite sintered body is not suitably used as the substrate of a package or multi-layer circuit board for housing semiconductor elements.

From the viewpoint of the sintering property of mullite, it is preferred that in the three-component composition of the vitreous phase, the amount of $SiO_2$ be up to 95% by weight, and in order to realize a low thermal expansion coefficient and a low dielectric constant, it is preferred that $SiO_2$, MgO and CaO be present in a composition satisfying the following requirements:

$95 \geq SiO_2 \geq 80$, $20 \geq MgO \geq 0$ and $20 \geq CaO \geq 0$ especially the following requirements:

$95 \geq SiO_2 \geq 90$, $10 \geq MgO \geq 0$ and $10 \geq CaO \geq 0$.

In accordance with a second embodiment of the present invention, a black mullite sintered body comprising 80.0 to 87.0% by weight of a mullite crystal phase, 0.5 to 5.0% by weight of molybdenum and 8.0 to 19.5% by weight of a vitreous phase containing at least one member selected from the group consisting of silica, magnesia and calcia is used as the insulating substrate 1.

In this embodiment of the present invention, if the amount of the mullite crystal phase in the mullite sintered body is smaller than 80% by weight, the amount of molybdenum is smaller than 0.5% by weight or the amount of the vitreous phase containing at least one member selected from the group consisting of $SiO_2$, MgO and CaO exceeds 19.5% by weight, the strength of the sintered body is low and the blackness is insufficient.

If the amount of the mullite crystal phase exceeds 87.0% by weight, the amount of molybdenum exceeds 5.0% by weight or the amount of the vitreous phase is smaller than 8.0% by weight, the sintering property is bad and a high strength cannot be obtained, and the color is grayish black. In each case, a practically satisfactory product cannot be obtained.

It is considered that blackening attained by the present invention is due to the fact that molybdenum absorbs visible rays over a broad wavelength region.

Incidentally, since molybdenum does not form a solid solution with the mullite crystal or the vitrious phase of the grain boundary but is dispersed in the sintered body, molybdenum does not degrade the insulating property of the mullite sintered body, and even if molybdenum forms a solid solution with the high-melting-point metal in the metallized metal layer, since the melting point of the solid solution is very high, no fusion state is brought about and the adhesion strength of the metallized metal layer is not degraded.

In accordance with a third embodiment of the present invention, a heat-dissipating ceramic member having a heat conductivity of at least 100 W/m·K° is attached at least to the outer surface of a semiconductor element-attaching portion of an insulating substrate composed of a mullite sintered body.

Figure 3:
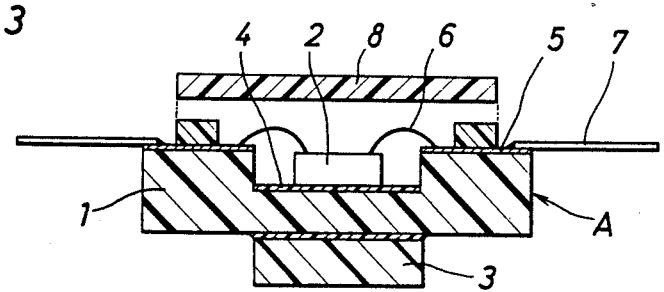
FIG. 3 is a sectional side view illustrating another package for housing semiconductor elements according to the present invention.

Referring to FIG. 3 illustrating this embodiment, a heat-dissipating member 3 is attached to the bottom face of the above-mentioned insulating substrate 1 to dissipate heat generated by a semiconductor integrated circuit element toward the outside.

The heat-dissipating member 3 is composed of a ceramic material having a heat conductivity of at least 100 W/m·K°, such as silicon carbide or aluminum nitride. In the case where the heat-dissipating member 3 is composed of silicon carbide, the heat-dissipating member 3 is formed, for example, by adding aluminum oxide, aluminum nitride, yttria or a rare earth element oxide to a powder of silicon carbide, molding the mixture into a plate according to a known press molding method and calcining the plate at a temperature of about 2000° C. in a non-oxidizing atmosphere.

The semiconductor integrated circuit element 2 is attached to the bottom face of the concave portion of the insulating substrate 1 through an adhesive, each electrode of the semiconductor integrated circuit element 2 is electrically connected to a metallized layer 5 through a wire 6, and a lid member 8 is attached to the insulating substrate 1 through a sealing material such as glass or a resin to seal an insulating vessel A air-tightly, whereby a semiconductor device is fabricated as the final product.

As is apparent from examples given hereinafter, the mullite substrate of the present invention has a dense structure and a thermal expansion coefficient substantially equal to that of silicon constituting the semiconductor integrated circuit element. Accordingly, if this mullite substrate is used as the substrate of a package or multi-layer circuit board for housing or mounting semiconductor integrated circuit elements, breaking of an electric wiring arranged on the surface is not caused and breaking or peeling of the semiconductor integrated circuit elements is not caused. Moreover, since the dielectric constant is sufficiently low, the propagation speed of a signal transmitted through the electric wiring can be increased, and recent semiconductor integrated circuit elements in which increase of the signal propagation speed is advanced can be housed and mounted.

According to the second embodiment of the present invention, a mullite sintered body having a uniformly black color is obtained, and a metallized metal layer can be formed on the surface with a high adhesion strength simultaneously with calcination for formation of the black mullite sintered body. Accordingly, a package or multi-layer circuit board having semiconductor integrated circuit elements housed or mounted therein can be manufactured efficiently in a high yield.

Moreover, according to the third embodiment of the present invention, since a heat-dissipating ceramic material having a heat conductivity of at least 100 W/m·K° is bonded at least to the surface of the element-attaching portion of the insulating substrate, the heat-dissipating property of the package is highly improved and the difference of the thermal expansion between the semiconductor element and the package is greatly diminished. Therefore, a high-reliability and high-quality package for housing large-size highly integrated semiconductor elements can be obtained.

The present invention will now be described in detail with reference to the following examples that by no means limit the scope of the invention.

EXAMPLE 1

A mullite powder comprising 76% by weight or $Al_2O_3$ and 24% by weight of $SiO_2$, and $SiO_2$, MgO and CaO having a composition shown in Table 1 were pulverized and mixed together with an organic solvent and alumina balls by an oscillating mill to form a starting slurry. Then, the starting slurry was dried and solidified, and a binder such as a wax, a dispersant and an organic solvent were added to the solid. Then, the mixture was dried and passed through a 100-mesh sieve to obtain a starting powder to be press-molded.

The so-obtained powder was molded under a pressure of 800 to 1200 kg/cm² and calcined for 2 hours in the open air at a calcination temperature of 1400° to 1900° C. to obtain a mullite sintered body.

The disk-shaped mullite sintered body having a diameter of 20 mm and a thickness of 2 mm was used for the measurement of the relative density and the identification of the crystal phase by the X-ray diffractometry, and the disk-shaped mullite sintered body having a diameter of 50 mm and a thickness of 1.5 mm was used for the measurement of the dielectric constant (at room temperature and 1 MHz). The polished mullite sintered body having a shape of a square column having a length of 15 mm and a side of 5 mm was used for the measurement of the thermal expansion coefficient (room temperature to 400° C.). The obtained results are shown in Table 1.

TABLE 1

| Sample No. | Composition (% by weight) | | | | | Relative Density (%) | Thermal Expansion Coefficient ($\times 10^{-6}$/°C.) | Dielectric Constant | Crystal Phase |
|---|---|---|---|---|---|---|---|---|---|
| | mullite | $SiO_2$ | MgO | CaO | total | | | | |
| 1* | 68 | 90 | 5 | 5 | 32 | 87 | 4.2 | 6.8 | mullite |
| 2* | 70 | 55 | 45 | 0 | 30 | 88 | 4.9 | 7.3 | mullite, spinel |
| 3* | " | " | 20 | 25 | " | 89 | " | " | mullite, alumina, anorthite |
| 4* | " | " | 0 | 45 | " | " | 5.0 | 7.4 | mullite, alumina, anorthite |
| 5 | " | 60 | 40 | 0 | " | 91 | 4.3 | 6.6 | mullite |
| 6 | " | " | 20 | 20 | " | " | " | 6.5 | mullite |
| 7 | " | " | 0 | 40 | " | " | " | 6.6 | mullite |
| 8 | " | 70 | 30 | 0 | " | 92 | 4.2 | " | mullite |
| 9 | " | " | 15 | 15 | " | " | " | 6.5 | mullite |
| 10 | " | " | 0 | 30 | " | 91 | " | 6.4 | mullite |
| 11 | " | 80 | 20 | 0 | " | 92 | 4.1 | 6.6 | mullite |
| 12 | " | " | 10 | 10 | " | 93 | " | 6.5 | mullite |
| 13 | " | " | 0 | 20 | " | " | " | 6.4 | mullite |
| 14 | " | 85 | 10 | 5 | " | " | " | " | mullite |
| 15 | 70 | 85 | 5 | 10 | 30 | 93 | 4.1 | 6.5 | mullite |
| 16 | " | 90 | 10 | 0 | " | " | 4.0 | 6.3 | mullite |
| 17 | " | " | 0 | 10 | " | 92 | 4.1 | 6.2 | mullite |
| 18 | " | 95 | 5 | 0 | " | 91 | 4.0 | " | mullite |
| 19 | " | " | 0 | 5 | " | 92 | " | 6.3 | mullite |
| 20* | " | 100 | 0 | 0 | " | 83 | 5.0 | 7.0 | mullite, cristobalite |
| 21* | 85 | 55 | 45 | 0 | 15 | 90 | 4.9 | 7.5 | mullite, spinel |
| 22* | " | " | 20 | 25 | " | 91 | 5.0 | 7.4 | mullite, alumina, anorthite |
| 23* | " | " | 0 | 45 | " | 90 | " | " | mullite, alumina, anorthite |
| 24 | 85 | 60 | 40 | 0 | 15 | 93 | 4.4 | 6.9 | mullite |
| 25 | " | " | 20 | 20 | " | 92 | 4.3 | 7.0 | mullite |
| 26 | " | " | 0 | 40 | " | " | 4.4 | " | mullite |
| 27 | " | 70 | 30 | 0 | " | 94 | 4.3 | 6.9 | mullite |
| 28 | " | " | 15 | 15 | " | 95 | " | 7.1 | mullite |
| 29 | 85 | 70 | 0 | 30 | 15 | 95 | 4.3 | 6.9 | mullite |
| 30 | " | 80 | 20 | 0 | " | " | 4.2 | 7.0 | mullite |
| 31 | " | " | 10 | 10 | " | 96 | " | 6.9 | mullite |
| 32 | " | " | 0 | 20 | " | 94 | " | 7.1 | mullite |
| 33 | " | 85 | 10 | 5 | " | 95 | 4.1 | " | mullite |
| 34 | " | 85 | 5 | 10 | 15 | 94 | 4.2 | 6.9 | mullite |

TABLE 1-continued

| Sample No. | Composition (% by weight) | | | | | Relative Density (%) | Thermal Expansion Coefficient ($\times 10^{-6}/°C.$) | Dielectric Constant | Crystal Phase |
|---|---|---|---|---|---|---|---|---|---|
| | mullite | $SiO_2$ | MgO | CaO | total | | | | |
| 35 | " | 90 | 10 | 0 | " | " | 4.1 | 6.8 | mullite |
| 36 | " | " | 0 | 10 | " | 93 | 4.2 | 6.7 | mullite |
| 37 | " | 95 | 5 | 0 | " | 92 | 4.1 | " | mullite |
| 38 | " | " | 0 | 5 | " | 93 | 4.0 | 6.8 | mullite |
| 39* | " | 100 | 0 | 0 | " | 82 | 4.8 | 7.2 | mullite, cristobalite |
| 40* | 95 | 55 | 45 | 0 | 5 | 91 | 5.2 | 7.6 | mullite, spinel |
| 41* | " | " | 20 | 25 | " | 92 | 5.1 | 7.5 | mullite, alumina, anorthite |
| 42* | 95 | 55 | 0 | 45 | 5 | 92 | 5.1 | 7.5 | mullite, alumina, anorthite |
| 43 | " | 60 | 40 | 0 | " | 94 | 4.4 | 7.0 | mullite |
| 44 | " | " | 20 | 20 | " | 93 | " | 7.1 | mullite |
| 45 | " | " | 0 | 40 | " | 94 | 4.5 | " | mullite |
| 46 | " | 70 | 30 | 0 | " | " | 4.4 | " | mullite |
| 47 | " | " | 15 | 15 | " | " | 4.3 | " | mullite |
| 48 | " | " | 0 | 30 | " | 95 | 4.4 | " | mullite |
| 49 | " | 80 | 20 | 0 | " | " | 4.3 | 7.0 | mullite |
| 50 | " | " | 10 | 10 | " | " | " | " | mullite |
| 51 | " | " | 0 | 20 | " | 94 | " | 7.1 | mullite |
| 52 | " | 85 | 10 | 5 | " | " | " | 7.0 | mullite |
| 53 | " | " | 5 | 10 | " | " | 4.2 | 6.9 | mullite |
| 54 | " | 90 | 10 | 0 | " | 93 | " | " | mullite |
| 55 | 95 | 90 | 0 | 10 | 5 | 92 | 4.2 | 6.8 | mullite |
| 56 | " | 95 | 5 | 0 | " | " | " | 6.9 | mullite |
| 57 | " | " | 0 | 5 | " | " | 4.1 | 6.8 | mullite |
| 58* | " | 100 | 0 | 0 | " | 80 | 4.7 | 7.3 | mullite, cristobalite |
| 59* | 97 | 90 | 5 | 5 | 3 | 86 | 4.4 | 7.1 | mullite |

Note *outside the scope of the present invention

As is apparent from the results shown in Table 1, in samples 1 and 59 where the amount of mullite is smaller than 70% by weight or larger than 95% by weight, the relative density is 87% or lower. In samples 20, 30 and 58 where only $SiO_2$ is added to mullite, cristobalite is formed as the crystal phase as well as mullite and the relative density is 83% or lower. In samples 2, 3, 4, 21, 22, 23, 40, 41 and 42 in which the composition of $SiO_2$, MgO and CaO is outside the range surrounded by the points A, B and C in FIG. 4, spinel or alumina and anorthite are formed as the crystal phase as well as mullite, and the thermal expansion coefficient is increased and $4.9 \times 10^{-6}/°C.$ or more, and any of these samples does not retain the inherent characteristics of mullite.

In contrast, in the mullite substrates of the present invention, the relative density is 91% or higher and the structure is dense, and the thermal expansion coefficient is sufficiently low and $4.5 \times 10^{-6}/°C.$ or less and the dielectric constant is 7.1 or lower. Especially in the mullite substrates of the present invention in which the composition of $SiO_2$, MgO and CaO is in the range surrounded by the points A, D and E in FIG. 4 (samples 11 through 19, 30 through 38 and 49 through 57), the thermal expansion coefficient is $4.3 \times 10^{-6}/°C.$ or less, and in the mullite substrates in which the composition of $SiO_2$, MgO and CaO is in the range surrounded by the points A, F and G in FIG. 4 (samples 16 through 19, 35 through 38 and 54 through 57), the thermal expansion coefficient is $4.2 \times 10^{-6}/°C.$ or lower and the dielectric constant is 6.9 or less.

EXAMPLE 2

A mullite powder having a purity of 99% and an average particle size of 2 μm, $SiO_2$, MgO and CaO as the sintering aid, and molybdenum oxide ($MoO_3$) were mixed and pulverized so that the composition after sintering was as shown in Table 2, whereby a starting slurry was prepared. The slurry was dried and mixed with a binder such as a wax, a dispersant and an organic solvent, and the obtained powder was molded under a pressure of 800 to 1200 kg/cm² and calcined in a reducing atmosphere (nitrogen/hydrogen atmosphere) for 2 hours at a calcination temperature of 1500° to 1650° C. to obtain a black mullite sintered body sample.

The black mullite sintered body sample was processed into a disk having a diameter of 50 mm and a thickness of 1.5 mm and the disk was used for the measurement of the relative density and dielectric constant. Furthermore, a polished square rod having a length of 15 mm and a side of 5 mm was used for the measurement of the thermal expansion coefficient (room temperature to 400° C.). Similarly, a rectangular column having a size of 40 mm × 3 mm × 4 mm was used for measuring the three-point flexural strength according to the method of JIS R-1601.

Furthermore, the mullite crystal phase in the sintered body and the amount of molybdenum were determined by the X-ray diffractory and ICP emission spectroscopic analysis. The obtained results are shown in Table 2.

A metallized metal layer of tungsten was formed on the surface of the black mullite sintered body, and nickel was plated on the surface of the metallized metal layer. A metal piece having a low thermal expansion coefficient was soldered to the nickel layer by using a low-melting-point solder. The tensile test was carried out by pulling the metal piece. It was found that a satisfactory metallizing strength was obtained in each sample.

TABLE 2

| Sample No. | composition of Sintared Body (% by weight) | | | Relative Density (%) | Thermal Expansion Coefficient ($\times 10^{-6}/°C$) | Fletural Strength (Kg/mm$^2$) | Dielectric Constant | Color |
| --- | --- | --- | --- | --- | --- | --- | --- | --- |
| | mullite crystal phase | molybdenum | vitreous phase | | | | | |
| *1 | 80.0 | 0.4 | 19.6 | 94.3 | 4.28 | 20.3 | 6.9 | gray |
| 2 | 80.0 | 0.5 | 19.5 | 93.9 | 4.35 | 21.5 | 7.0 | black |
| 3 | 80.0 | 0.7 | 19.3 | 94.5 | 4.26 | 21.1 | 6.8 | black |
| 4 | 81.0 | 1.5 | 17.5 | 95.1 | 4.28 | 20.7 | 6.9 | black |
| 5 | 82.0 | 2.0 | 16.0 | 94.9 | 4.33 | 22.5 | 7.1 | black |
| 6 | 83.0 | 2.5 | 14.5 | 95.3 | 4.37 | 21.2 | 7.0 | black |
| 7 | 84.0 | 3.3 | 12.7 | 94.6 | 4.41 | 20.5 | 7.2 | black |
| 8 | 85.0 | 4.0 | 11.0 | 94.0 | 4.40 | 21.3 | 7.0 | black |
| 9 | 86.0 | 4.7 | 9.3 | 93.3 | 4.45 | 20.0 | 7.1 | black |
| 10 | 87.0 | 5.0 | 8.0 | 93.0 | 4.38 | 19.6 | 7.3 | black |
| *11 | 87.0 | 5.2 | 7.8 | 91.8 | 4.43 | 15.7 | 7.4 | grayish black |

Note *outside the scope of the present invention

As is apparent from the results shown in Table 2, in samples 1 and 11 in which the amount of molybdenum in the sintered body is smaller than 0.5% by weight or larger than 5.0% by weight, the color is gray or grayish black, and the sintered body is not suitable for practical use.

In contrast, samples 2 through 10 according to the present invention have a uniform black color, and the thermal expansion coefficient, flexural strength and dielectric constant of each of these samples are satisfactory and each sample is suitable as the substrate of a package for housing semiconductor elements or a multilayer circuit board for mounting semiconductor integrated circuit elements thereon.

EXAMPLE 3

In a 40 cm-square insulating substrate composed of a mullite sintered body (main component: 3Al$_2$O$_3$.2SiO$_2$), which had a structure shown in FIG. 3, a thin film layer of an activating metal such as titanium (Ti) or chromium (Cr) was formed on the bottom face, that is, the surface opposite to the surface of a die attachment 4 to which a semiconductor integrated circuit element 2 was attached, by such means as vacuum evaporation deposition. A square plate of a silicon carbide sintered body or aluminum nitride sintered body shown in Table 3 was attached as the heat-dissipating member 3 was bonded to the thin film layer by using a silver solder corresponding to the BAg-8 standard. Then, a bipolar ECL logical operation circuit element was attached to the die attachment 4 of the insulating substrate 1 by using a preform of an alloy comprising 98% of Au and 2% of Si. Then, an electrode of the above-mentioned element was connected to one end of the metallized metal layer 5 formed on the insulating substrate 1 by using a bonding aluminum wire having a diameter of 30 μm to attain electric conduction and form a test piece.

The obtained test piece was hung in the stationary open air and an electric current corresponding to a power consumption of 7 W was supplied to the logical operation circuit element. At intervals of 30 seconds after the start of supply of the electric current, a metal-sheathed thermocouple having a diameter of 0.5 mm was brought into contact with the central part of the logical operation circuit element for 5 seconds to measure the electromotive force, and the heat-dissipating property was evaluated based on the temperature at which the electromotive force became constant.

The obtained results are shown in Table 3.

With respect to each sample, twenty test pieces were moved alternately between water maintained 0° C. and water maintained at 100° C. within 2 seconds and dipped in each water for 1 minute. This heat cycle was repeated 100 times, and the presence or absence of cracks in the logical operation circuit element was checked by a microscope at 30 magnifications. Simultaneously, according to the standard of MIL-STD-883, 2211, the tie pick test was carried out by applying a shearing force once to the bonded face of each peripheral side of the element. In any sample, cracks were not observed and peeling of the element from the die attachment of the package was not caused.

Before attachment of the above-mentioned bipolar logical operation circuit element, the signal propagation speed of the substrate having the heat-dissipating member 3 bonded thereto was evaluated according to the time domain reflection method (TDR method) in which the time required for a pulse signal to reflect and return through the electric wiring was measured. It was found that the signal propagation speed was 86 to 92 ps/cm in each sample and was much excellent over the signal propagation speed of the conventional alumina package, that is, about 102 ps/cm.

TABLE 3

| Sample No. | Package Thickness (mm) in Die Attachment (mm) | Heat-Dissipating Member | | | | Surface Temperature (°C.) of Semiconductor Element | Remarks |
| --- | --- | --- | --- | --- | --- | --- | --- |
| | | Material | Heat conductivity (W/m · K) | Thickness (mm) | Size (mm) of One Side | | |
| 1 | 1.0 | SiC | 270 | 1.0 | 15 | 59 | |
| 2 | 1.5 | " | " | " | " | 60 | |
| 3 | 2.0 | " | " | " | " | 62 | |
| 4 | 3.0 | " | " | " | " | 65 | |
| 5 | 1.0 | " | " | " | 40 | 48 | |
| 6 | 1.5 | " | " | " | " | 50 | |
| 7 | 2.0 | " | " | " | " | 53 | |
| 8 | 3.0 | " | " | " | " | 57 | |
| 9 | 1.0 | " | " | 2.0 | 15 | 54 | |
| 10 | 1.5 | " | " | " | " | 57 | |

TABLE 3-continued

| Sample No. | Package Thickness (mm) in Die Attachment (mm) | Heat-Dissipating Member | | | | Surface Temperature (°C.) of Semiconductor Element | Remarks |
|---|---|---|---|---|---|---|---|
| | | Material | Heat conductivity (W/m · K) | Thickness (mm) | Size (mm) of One Side | | |
| 11 | 2.0 | " | " | " | " | 59 | |
| 12 | 3.0 | " | " | " | " | 60 | |
| 13 | 1.0 | " | " | " | 40 | 47 | |
| 14 | 1.5 | SiC | 270 | 2.0 | 40 | 49 | |
| 15 | 2.0 | " | " | " | " | 51 | |
| 16 | 3.0 | " | " | " | " | 53 | |
| 17 | 1.0 | AlN | 260 | 1.0 | 15 | 63 | |
| 18 | 1.5 | " | " | " | " | 62 | |
| 19 | 2.0 | " | " | " | " | 65 | |
| 20 | 3.0 | " | " | " | " | 68 | |
| 21 | 1.0 | " | " | " | 40 | 51 | |
| 22 | 1.5 | " | " | " | " | 54 | |
| 23 | 2.0 | " | " | " | " | 56 | |
| 24 | 3.0 | " | " | " | " | 61 | |
| 25 | 1.0 | " | " | 2.0 | 15 | 57 | |
| 26 | 1.5 | " | " | " | " | 59 | |
| 27 | 2.0 | AlN | 260 | 2.0 | 15 | 60 | |
| 28 | 3.0 | " | " | " | " | 62 | |
| 29 | 1.0 | " | " | " | 40 | 52 | |
| 30 | 1.5 | " | " | " | " | 53 | |
| 31 | 2.0 | " | " | " | " | 55 | |
| 32 | 3.0 | " | " | " | " | 58 | |
| 33 | 1.0 | " | 100 | 1.0 | 15 | 69 | |
| 34 | 3.0 | " | " | " | " | 69 | |
| 35 | 1.0 | " | " | " | 40 | 64 | |
| 36 | 3.0 | " | " | " | " | 66 | |
| 37 | 1.0 | " | " | 2.0 | 15 | 67 | |
| 38 | 3.0 | " | " | " | " | 68 | |
| 39 | 1.0 | " | " | " | 40 | 69 | |
| 40 | 3.0 | AlN | 100 | 2.0 | 40 | 69 | |
| 41* | 1.0 | " | 80 | 1.0 | 15 | 75 | |
| 42* | " | " | " | " | 40 | 72 | |
| 43* | " | " | " | 2.0 | 15 | 73 | |
| 44* | " | " | " | " | 40 | 71 | |
| 45 | 1.0 | — | — | — | — | 95 | Comparison |
| 46 | 1.5 | — | — | — | — | 93 | " |
| 47 | 2.0 | — | — | — | — | 92 | " |
| 48 | 3.0 | — | — | — | — | 90 | " |

Note *outside the scope of the present invention

As is apparent from the results shown in Table 3, in the comparative samples (samples 45 through 48) to which a heat-dissipating ceramic member having a heat conductivity of at least 100 W/m·K° is not bonded, the surface temperature exceeds the normal operation temperature for a semiconductor integrated circuit element, that is, 70° C. and is elevated to 90° C. or higher. In samples 41 through 44 to which a heat dissipating member having a heat conductivity lower than 100 W/m·K° is attached, the surface temperature exceeds 70° C. and the heat-dissipating property is insufficient.

In contrast, in the samples of the present invention to which a heat-dissipating ceramic member having a heat conductivity of at least 100 W/m·K° is bonded, the surface temperature of the semiconductor element is 69° C. or lower, and a sufficient heat-dissipating effect is attained.

We claim:

1. A package for housing at least one semiconductor element, which comprises an insulating substrate having in the interior thereof a cavity for attaching and housing the semiconductor elements and a lid member covering said cavity, wherein the insulating substrate is composed of a mullite sintered body comprising 70 to 95% by weight of mullite and 5 to 30% by weight, as the total content, of silica ($SiO_2$) and at least one member selected from the group consisting of magnesia (MgO) and calcia (CaO), and $SiO_2$, MgO and CaO are present in the following composition expressed by % by weight based on the three components:

$100 > SiO_2 \geqq 60$, $40 \geqq MgO \geqq 0$ and $40 \geqq CaO \geqq 0$.

2. A package as set forth in claim 1, wherein $SiO_2$, MgO and CaO are present in the following composition expressed by % by weight based on the three components:

$95 \geqq SiO_2 \geqq 60$, $40 \geqq MgO \geqq 0$ and $40 \geqq CaO \geqq 0$.

3. A package as set forth in claim 1, wherein $SiO_2$, MgO and CaO are present in the following composition expressed by % by weight based on the three components:

$95 \geqq SiO_2 \geqq 80$, $20 \geqq MgO \geqq 0$ and $20 \geqq CaO \geqq 0$.

4. A package as set forth in claim 1, wherein $SiO_2$, MgO and CaO are present in the following composition expressed by % by weight based on the three components:

$$95 \geq SiO_2 \geq 90,$$

$$10 \geq MgO \geq 0 \text{ and}$$

$$10 \geq CaO \geq 0.$$

5. A package as set forth in claim 1, wherein the mullite sintered body is associated with an inherent theoretical density which is the density of the body when it is completely free of pores, and the mullite sintered body has an actual density which is at least 91% of the theoretical density.

6. A package as set forth in claim 1, wherein the mullite sintered body has a thermal expansion coefficient lower than $4.5 \times 10^{-6}/°C$. and a dielectric constant lower than 7.1.

7. A package as set forth in claim 1, wherein the mullite sintered body has a crystal phase composed substantially solely of the mullite and a viterous phase constituting a grain boundary of the crystal phase and composed of the $SiO_2$, MgO and CaO.

8. A package for housing at least one semiconductor element, which comprises an insulating substrate having in the interior thereof a cavity for attaching and housing the semiconductor element and a lid member covering said cavity, wherein the insulating substrate is composed of a black mullite sintered body comprising 80.0 to 87% by weight of a mullite crystal phase, 0.5 to 5.0% by weight of molybdenum and 8.0 to 19.5% by weight of a viterous phase containing at least one member selected from the group consisting of silica, magnesia and calcia.

9. A package as set forth in claim 8, wherein the black mullite sintered body has a surface and the insulating substrate has a metallized layer of tungsten, molybdenum of manganese formed on at least a part of the surface of the black mullite sintered body.

10. A package for housing at least one semiconductor element which comprises an insulating substrate having in the interior thereof a cavity for attaching and housing the semiconductor element and a lid member covering said cavity, wherein the insulating substrate is composed of a mullite sintered body comprising a mullite crystal phase and a viterous grain boundary phase, the insulating substrate having an outer surface which is opposite the cavity and faces away from the cavity and the lid member, the package further comprising a heat-dissipating ceramic member having a heat conductivity of at least 100 W/m·K° attached at least to the other surface of the insulating substrate.

11. A package as set forth in claim 10, wherein the heat-dissipating member is composed of a silicon carbide sintered body.

12. A package as set forth in claim 10, wherein the heat-dissipating ceramic member is composed of an aluminum nitride sintered body.

13. A package as set forth in claim 10, wherein the insulating substrate is composed of a mullite sintered body comprising 70 to 95% by weight of mullite and 5 to 30% by weight, as the total content, of silica ($SiO_2$) and at least one member selected from the group consisting of magnesia (MgO) and calcia (CaO), and $SiO_2$, MgO and CaO are present in the following composition expressed by % by weight based on the three components:

$$100 > SiO_2 \geq 60,$$

$$40 \geq MgO \geq 0 \text{ and}$$

$$40 \geq CaO \geq 0.$$

14. A package as set forth in claim 10, wherein the insulating substrate is composed of a black mullite sintered body comprising 80.0 to 87% by weight of a mullite crystal phase, 0.5 to 5.0% by weight of molybdenum and 8.0 to 19.5% by weight of a vitreous phase containing at least one member selected from the group consisting of silica, magnesia and calcia.

15. A black mullite sintered body comprising 80.0 to 87% by weight of a mullite crystal phase, 0.5 to 5.0% by weight of molybdenum and 8.0 to 19.5% by weight of a vitreous phase containing at least one member selected from the group consisting of silica, magnesia and calcia.

16. A mullite sintered body substrate comprising 70 to 95% by weight of mullite and 5 to 30% by weight, as the total content, of silica ($SiO_2$) and at least one member selected from the group consisting of magnesia (MgO) and calcia (CaO), and $SiO_2$, MgO and CaO are present in the following composition expressed by % by weight based on the three components:

$$100 > SiO_2 \geq 60,$$

$$40 \geq MgO \geq 0 \text{ and}$$

$$40 \geq CaO \geq 0.$$

* * * * *